United States Patent [19]
Coppens et al.

[11] Patent Number: 6,130,023
[45] Date of Patent: Oct. 10, 2000

[54] METHOD FOR MAKING LITHOGRAPHIC PRINTING PLATES ACCORDING TO THE SILVER SALT DIFFUSION TRANSFER PROCESS

[75] Inventors: Paul Coppens, Turnhout; Eric Hoes, Herentals; Ludovicus Vervloet, Kessel; Brigitte Parmentier, Aartselaar, all of Belgium

[73] Assignee: AGFA-Gevaert, N.V., Mortsel, Belgium

[21] Appl. No.: 08/290,116

[22] Filed: Aug. 15, 1994

[30] Foreign Application Priority Data

Dec. 17, 1993 [EP] European Pat. Off. ............. 93203570

[51] Int. Cl.$^7$ ................ G03F 7/07; G03C 8/42; G03C 3/00
[52] U.S. Cl. .................... 430/207; 206/455; 430/204
[58] Field of Search ................... 430/204, 207; 206/455

[56] References Cited

U.S. PATENT DOCUMENTS

| | | | |
|---|---|---|---|
| 3,561,966 | 2/1971 | Sewall | 430/207 |
| 3,645,388 | 2/1972 | Fessenden | 206/455 |
| 3,652,278 | 3/1972 | Asano et al. | 430/551 |
| 4,784,906 | 11/1988 | Akao | 206/455 |
| 5,026,600 | 6/1991 | Akao | 206/455 |
| 5,068,165 | 11/1991 | Coppens et al. | 430/204 |
| 5,196,290 | 3/1993 | Coppens et al. | 430/204 |
| 5,273,858 | 12/1993 | Coppens et al. | 430/204 |

OTHER PUBLICATIONS

Birr, *Stabilization of Photographic Silver Halide Emulsions*, C1974, Focal Press, New York, pp 19–23, 26.

*Primary Examiner*—Richard L. Schilling
*Attorney, Agent, or Firm*—Breiner & Breiner

[57] ABSTRACT

The present invention provides a method for making an offset printing plate according to the silver salt diffusion transfer process comprising the steps of:

(a) image-wise exposing an imaging element comprising (i) a hydrophilic base, (ii) an image receiving layer containing physical development nuclei, (iii) an intermediate layer, and (iv) a silver halide emulsion layer, (b) applying an aqueous alkaline solution to the imaging element in the presence of (a) developing agent(s) and (a) silver halide solvent(s) to form image-wise in said image receiving layer a silver image, (c) treating the imaging element to remove the layer(s) on top of said image receiving layer, characterized in that said imaging element has been stored before image-wise exposure in a surrounding having at 22° C. a relative humidity between 20% and 50%.

According to the present invention there is also provided a package of the imaging element, making said imaging element suitable for use in the above defined method.

6 Claims, No Drawings

METHOD FOR MAKING LITHOGRAPHIC PRINTING PLATES ACCORDING TO THE SILVER SALT DIFFUSION TRANSFER PROCESS

DESCRIPTION

1. Field of the Invention

The present invention relates to a method for making improved offset printing plates according to the silver salt diffusion transfer process. Furthermore the present invention relates to a package of imaging elements suitable for use in the method defined above.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving layer and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two main types of mono-sheet DTR imaging elements exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the emulsion layer. Printing plates of this type have a low printing endurance typically around 10000 copies.

According to a second type a hydrophilic support, mostly anodized aluminium, is provided in the order given with a layer of physical development nuclei and a silver halide emulsion layer. After information-wise exposure and development the imaged element is treated to remove the emulsion layer so that a support carrying a silver image is left wich is used as a printing plate. Printing plates of this type have a much higher printing endurance typically at least 25000 copies. Such type of lithographic printing plate is disclosed e.g. in U.S. Pat. No. 3,511,656, EP-A-278766, EP-A-410500 and EP-A-483415.

It has however been found that the lithographic properties of a lithographic printing plate obtained from a mono-sheet DTR imaging element of the second type deteriorates upon storage of said imaging element.

SUMMARY OF THE INVENTION

It is an object of the present invention to provide an imaging element for making offset printing plates according to the silver salt diffusion transfer process having an improved storage stability.

Further objects of the present invention will become clear from the description hereinafter.

According to the present invention there is provided a method for making an offset printing plate according to the silver salt diffusion transfer process comprising the steps of:

(a) image-wise exposing an imaging element comprising in the order given (i) a hydrophilic base, (ii) an image receiving layer containing physical development nuclei, (iii) an intermediate layer comprising a non-proteinic hydrophilic film-forming polymer or hydrophobic polymer beads having an average diameter not lower than 0.2 $\mu$m and having been prepared by polymerization of a ethylenically unsaturated monomer, and (iv) a photosensitive layer containing a silver halide emulsion being in water permeable relationship with said image receiving layer, (b) applying an aqueous alkaline solution to the imaging element in the presence of (a) developing agent(s) and (a) silver halide solvent(s) to form a silver image in said photosensitive layer and to allow unreduced silver halide or complexes formed thereof to diffuse image-wise from the photosensitive layer to said image receiving layer to produce therein a silver image, (c) treating the imaging element to remove the layers on top of said image receiving layer, thereby uncovering said silver image formed in said image receiving layer, characterized in that said imaging element has been stored before image-wise exposure in a surrounding having at 22° C. a relative humidity between 20% and 50%.

According to the present invention there is also provided a package of the imaging element, making said imaging element suitable for use in the above defined method.

DETAILED DESCRIPTION OF THE INVENTION

According to the present invention it has been found that a lithographic printing plate obtained according to the DTR-process by using an imaging element of the second type that has been stored before image-wise exposure in a surrounding with a relative humidity at 22° C. between 20% and 50% produces prints with almost no white spots in the printing areas and that during the preparation of said plate the emulsion layer is easily and completely removed. When an imaging element has not been stored in such surrounding, there occurs a hardening of the emulsion layer, resulting in an incomplete removal of the emulsion layer and the intermediate layer, thereby causing in said places of incomplete removal an insufficient differentiation between ink accepting and non-ink accepting properties of the printing plate. This incomplete removal is not avoided by the presence of the intermediate layer which facilates the removal of said layer (packet) as disclosed in EP-A-410500 andin EP-A-483415. Furthermore there also occurs fogging of the emulsion layer, resulting in a lowered silver deposition on the image receiving layer, thereby causing a drastically reduced endurance of the printing plate.

By the surrounding of the imaging element is understood that part of the atmosphere which is in free contact with the imaging element.

The relative humidity of the surrounding of the imaging element is measured with a Hygroscoop Rotronic Type GTS-200-50 (marketed by Krautli N.V., Groot Bijgaarden, Belgium) by adjusting the temperature of the imaging element and its surrounding to 22° C., bringing the sensor element of the Hygroscoop Rotronic Type GTS-200-50 in the surrounding and waiting for 60 seconds.

According to the invention the imaging element has been stored in a surrounding having at 22° C. a relative humidity between 20% and 50%. Preferably the imaging element has been stored in a surrounding having at 22° C. a relative humidity between 30% and 40%.

The imaging element is preferably prepared by coating the different layers on a hydrophilic base. Alternatively the different layers may be laminated to said image receiving layer from a temporary base holding the layers in reverse order as disclosed in U.S. Pat. No. 5,213,943.

Subsequently the imaging element is conditioned, cut in sheets and packaged in a packaging material which is impermeable to water or minimizes the amount of water that can penetrate into the package whereafter the packaging material is sealed. Suitable packaging materials have an air permeability of less than 3.5 ml/s as measured according to DIN 53120. Examples of suitable packaging materials are e.g. aluminium foils and laminates of aluminium, high density polyethylene packaging material, laminates of uniaxially oriented polyethylene films with the orientation perpendicular to each other etc. . . .

According to the invention, the surrounding of the imaging element in such a package has at 22° C. a relative humidity between 20% and 50%, preferably between 30% and 40%. Said surrounding can be obtained by conditioning and/or cutting and/or packaging the imaging element in an atmosphere which has at 22° C. a relative humidity between 20% and 50%, preferably between 30% and 40%

Preferably such a sealed package contains as the bottom and the top sheet a cardboard sheet, more preferably a cardboard sheet having a weight of more than 300 g/m$^2$ and containing less than 40 ppm by weight of formaldehyde.

In general, a package contains more than 1 sheet of the imaging element. In that case, it is preferred to put a paper spacer between each sheet of the imaging element. More preferably said paper spacer has a weight of more than 15 g/m$^2$, contains less than 20 ppm by weight of formaldehyde and has a pH of less than 9, as measured by soaking 15 g of finely divided spacer in 300 ml of distilled water for 24 hours and registering the pH of the obtained solution. Suitable papers are manufactured by e.g. Glory Mills Papers Ltd, G.B., Neubrucker Papier, Austria, Intermills N.V., Belgium, Illig'sche Papierfabrik Gmbh, Germany and Leinfelder G. Gmbh, Germany.

The imaging element used according to the invention, comprises in the order given (i) a hydrophilic base, (ii) an image receiving layer containing physical development nuclei, (iii) an intermediate layer and (iv) a photosensitive layer containing a silver halide emulsion being in water permeable relationship with said image receiving layer.

The hydrophilic base can be a hardened hydrophilic layer, containing a hydrophilic synthetic homopolymer or copolymer and a hardening agent coated on a flexible support. Preferred hydrophilic layers are layers of polyvinyl alcohol hardened with a tetraalkyl orthosilicate and preferably containing $SiO_2$ and/or $TiO_2$, wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference. More preferably said layers also contain physical development nuclei in an amount between 0.2 and 2 mg/m$^2$.

Most preferably an aluminium support is used as a hydrophilic base.

The aluminium support of the imaging element for use in accordance with the present invention can be made of pure aluminium or of an aluminium alloy, the aluminium content of which is at least 95%. The thickness of the support usually ranges from about 0.13 to about 0.50 mm.

The preparation of aluminium or aluminium alloy foils for lithographic offset printing comprises the following steps: graining, anodizing, and optionally post-treating of the foil. Preferably the aluminium foil has a roughness with a CLA value between 0.2 and 1.5 $\mu$m, an anodization layer with a thickness between 0.4 and 2.0 $\mu$m and is post-treated with an aqueous bicarbonate solution.

According to the present invention the roughening of the aluminium foil can be performed according to the methods well known in the prior art. The surface of the aluminium substrate can be roughened either by mechanical, chemical or electrochemical graining or by a combination of these to obtain a satisfactory adhesiveness of a silver halide emulsion layer to the aluminium support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. . . . .

Electrochemical graining in connection with the present invention can be performed using single-phase and three-phase alternating current. The voltage applied to the aluminium plate is preferably 10–35 V. A current density of 3–150 Amp/dm$^2$ is employed for 5–240 seconds. The temperature of the electrolytic graining solution may vary from 5–50° C. Electrochemical graining is carried out preferably with an alternating current from 10 Hz to 300 Hz.

The roughening is preferably preceded by a degreasing treatment mainly for removing fetty substances from the surface of the aluminium foil.

Therefore the aluminium foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminium foil is anodized which may be carried out as follows.

An electric current is passed through the grained aluminium foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0–70° C. The anodic current density may vary from 1–50 $A/dm^2$ and a voltage within the range 1–100 V to obtain an anodized film weight of 1–8 $g/m^2$ $Al_2O_3.H_2O$. The anodized aluminium foil may subsequently be rinsed with demineralised water within a temperature range of 10–80° C.

After the anodizing step a posttreatment such as sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

A preferred posttreatment is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

Subsequent to the preparation of the hydrophilic base as described above the hydrophilic base may be immediately coated with a solution containing the physical development nuclei or may be coated with said solution at a later stage.

The image receiving layer for use in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form. More preferred development nuclei for use in accordance with the present invention are nuclei, especially sulphides of heavy metals having an average diameter less than 6 nm and wherein the number of nuclei having a diameter larger than 4.5 nm is less than 15% of the total number of nuclei contained in said image receiving layer as disclosed in EP-A 546.598. Especially preferred development nuclei in connection with the present invention are palladium sulphide nuclei having an average diameter less than 6 nm and wherein the number of nuclei having a diameter larger than 4.5 nm is less than 15% of the total number of nuclei contained in said image receiving layer.

The distance between the development nuclei for use in accordance with the present invention is an important factor with regard to the printing endurance of a lithographic plate of the second type obtained according to the silver salt diffusion transfer process. Preferably, the distance between a development nucleus and the nearest one is for at least 90% of the number of development nuclei between 100 nm and 5 nm, more preferably between 50 nm and 5 nm, most preferably between 20 nm and 7 nm.

To promote the image sharpness the hydrophilic base can be provided with a very thin antihalation coating of a dye or pigment or the image receiving layer may incorporate at least one antihalation dye or pigment.

The photosensitive layer used in accordance with the present invention may be any layer comprising a hydrophilic colloid binder and at least a silver halide emulsion, at least one silver halide emulsion being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 $\mu$m, preferably from 0.25 to 0.45 $\mu$m.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$.

The silver halide emulsions can be chemically sensitized. A method of chemical sensitization has been described in the article of R.KOSLOWSKY, Z. Wiss. Photogr. Photophys. Photochem. 46, 65–72 (1951).

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons.

The spectral photosensitivity of the silver halide can also be adjusted for exposure by laser light e.g. helium-neon laser light, argon laser light, and solid state laser light. Dyes that can be used for adjusting the photosensitivity to laser light have been disclosed i.a. in the documents cited in EP-A-93200339.5 and U.S. Pat. No. 5,200,294.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPa.s at a shearing rate of 1000 s$^{-1}$ combined with a gelatin of a higher viscosity. The weight ratio of said low viscosity gelatin versus the gelatin of a higher viscosity is preferably >0.5.

Preferably the gelatin layer(s) is(are) substantially unhardened. Substantially unhardened means that when such gelatin layer is coated on a subbed polyethylene terephtalate film base at a dry thickness of 1.2 g/m$^2$, dried for 3 days at 57° C. and 35% R.H. and dipped in water of 30° C., said gelatin layer is dissolved for >95% by weight within 5 minutes.

The silver halide emulsions may contain pH controlling ingredients. Preferably the silver halide emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P-2,453,217.

More details about the composition, preparation and coating of silver halide emulsions suitable for use in accordance with the present invention can be found in e.g. Product Licensing Index, Vol. 92, December 1971, publication 9232, p. 107–109.

The imaging element also comprises an intermediate layer between the image receiving layer on the hydrophilic base and the photosensitive layer(packet) to facilate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m2 and comprising at least one non-proteinic hydrophilic film-forming polymer and optionally comprising an antihalation dye or pigment as disclosed in EP-A-410500.

In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

When the imaging element is prepared by laminating a layer packet comprising a photosensitive layer onto the image receiving layer the intermediate layer(s) are provided on the photosensitive layer(s), the water-swellable intermediate layer or the intermediate layer comprising hydrophobic polymer beads having an average diameter not lower than 0.2 μm and having been prepared by polymerization of at least one ethylenically unsaturated monomer being the upper layer.

A wide choice of cameras for exposing the photosensitive silver halide emulsion exists on the market. Horizontal, vertical and darkroom type cameras and contact-exposure apparatus are available to suit any particular class of reprographic work. The imaging element can also be exposed with the aid of i.a. laser recorders and cathode rays tubes.

The development and diffusion transfer are effected with the aid of an aqueous alkaline solution in the presence of (a) developing agent(s) and (a) silver halide solvent(s). The developing agent(s) and/or the silver halide solvent(s) can be incorporated in the aqueous alkaline solution and/or in said silver halide emulsion layer and/or in any of said intermediate layers and/or in a supplemental hydrophilic colloid layer in water-permeable relationship with said silver halide emulsion layer. The latter supplemental hydrophilic colloid layer can be coated on top of said silver halide emulsion layer remotest from said hydrophilic base.

The silver halide solvent can also be incorporated at least in part in the physical development nuclei containing layer. When the aqueous alkaline solution does not comprise the developing agent(s), it is merely an activating liquid that is capable of dissolving the developing agent(s) contained in one of the layers.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. More details are disclosed in EP-A-93201649.6. However other developing agents can be used. Preferred amounts of the hydroquinone-type developing agents are in the range of 0.05 mole to 0.25 mole per liter and preferred amounts of secondary developing agent(s) in the range of 1.8×10$^{-3}$ to 2.0×10$^{-2}$ mole per liter.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are alkanolamines. Alkanolamines that are suitable for use in accordance with the present invention may be of the tertiary, secundary or primary type. Examples of alkanolamines that may be used in connection with the present invention are disclosed in e.g. EP-A 549.830.

The alkanolamines are preferably present in the alkaline processing liquid in a concentration preferably between 0.05% and 10% by weight. However part or all of the alkanolamine can be present in one or more layers of the imaging element.

Further suitable silver halide solvents are thioethers. Preferably used thioethers are disclosed in e.g. U.S. Pat. No. 4,960,683 and U.S. Pat. No. 5, 200,294.

Still further suitable silver halide solvents are meso-ionic compounds. Preferred meso-ionic compounds for use in accordance with the present invention are triazolium thiolates and more preferably 1,2,4-triazolium-3-thiolates. More details are disclosed in EP-A 554.585.

Still further suitable silver halide solvents are sulphite, amines, 2-mercaptobenzoic acid and those disclosed in "The Theory of the Photographic Process" 4th Ed., edited by T. H. James, pages 474–475. Further interesting silver halide solvents have been described in i.a. U.S. Pat. Nos. 2,857, 276, 4,355,090, 4,297,429 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is also possible to incorporate at least one silver halide solvent into a suitable layer of the imaging element and to add at least one other silver halide solvent to the developing solution.

Examples of suitable combinations of different silver halide solvents are a combination of (an) alkanolamine(s) and a thiosulfate as disclosed in EP-A 549.831 and 4,6-dihydroxypyrimidines in combination with other silver halide solvents as disclosed in EP-A 549.830.

The aqueous alkaline solution may further comprise sulphite e.g. sodium sulphite in an amount ranging from 40 g to 180 g per liter, preferably from 60 to 160 g per liter, and a silver halide solvent, preferably a water soluble thiosulphate and/or thiocyanate in an amount ranging from 5 g to 20 g per liter.

Examples of other suitable combinations of different silver halide solvents are combinations of a meso-ionic compound and another silver halide solvent as disclosed in EP-A 554.585.

Combinations of at least one silver halide solvent and a regulator may also be used. Suitable regulators are disclosed in EP-A 547.660 and in EP-A 576.736.

The aqueous alkaline solution used according to the present invention preferably comprises aluminium ions in an amount of at least 0.3 g/l in order to prevent sticking of the emulsion layer to the transporting rollers when the emulsion is swollen with the aqueous alkaline solution. More preferably the aqueous alkaline solution used in accordance with the present invention comprises aluminium ions in an amount of at least 0.6 g/l.

The alkaline processing liquid preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help providing the pH and serve as a silver halide complexing agent.

The processing conditions such as pH, temperature and time may vary within broad ranges provided the mechanical strength of the materials to be processed is not adversely influenced and no decomposition takes place.

The aqueous alkaline solution may further comprise hydrophobizing agents for improving the hydrophobicity of the silver image obtained in the image image receiving layer. Generally these compounds contain a mercapto group or thiolate group and one or more hydrophobic substituents. Examples of hydrophobizing agents are e.g. those described in U.S. Pat. No. 3,776,728, and U.S. Pat. No. 4,563,410. Particularly preferred hydrophobizing agents are long chain (at least 5 carbon atoms) alkyl substituted mercaptotetrazoles. More details are disclosed in EP-A-93201649.6. The hydrophobizing agents can be used alone or in combination with each other.

The aqueous alkaline solution preferably also comprises oxidation preservatives, a compound releasing bromide ions, calcium-sequestering compounds e.g. EDTA or its sodium salt, thickening agents e.g. cellulose or its derivatives such as carboxymethylcellulose and anti-sludge agents.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6 as disclosed in EP-A-519,123.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C.

After formation of the silver image on the lithographic image receiving element an excess of alkaline solution still present on the monosheet layer assemblage may be eliminated, preferably by guiding the monosheet layer assemblage through a pair of squeezing rollers.

The silver image thus obtained in the image receiving layer is subsequently uncovered by treating the imaging element to remove the photosensitive layer and the intermediate layer.

Various embodiments for removing the photosensitive layer and the intermediate layer(s) are disclosed in EP-A 483,415.

According to a particularly preferred embodiment for removing the photosensitive layer(s) and the intermediate layer(s) the imaging element is held under a spray or jet of rinsing water or rinsing aqueous medium. The rinsing aqueous medium used to detach the intermediate layer(s) and the emulsion layer(s).(s) by rinsing may comprise ingredients such as i.a. wetting agents, and hardeners including latent hardeners.

The temperature of the rinsing water may be varied widely but is preferably between 20° C. and 45° C.

The aqueous alkaline solution and/or the rinsing aqueous medium suitable for use according to the present invention may comprise biocides such as 5-bromo-5-nitro-1,3-dioxane, 3-methyl-4-chloro-phenol, o-phenyl-phenol, p-phenyl-phenol etc. Preferably, said biocides are used in the aqueous alkaline solution in a concentration of at least 0.1 g/l, more preferably in a concentration of at least 1 g/l or in the rinsing aqueous medium in a concentration of at least 25 mg/l, more preferably in a concentration of at least 115 mg/l.

The imaged surface of the lithographic base can be subjected to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the hydrophilic grained and anodized aluminium support. Examples of said compounds enhancing the ink-receptivity are disclosed in e.g. U.S. Pat. No. 3,776,728, U.S. Pat. No. 4,563,410 and EP-A-93201878.1 which therefor are incorporated herein by reference. Preferably, said composition also comprises a surfactant.

At the moment the treatment with the fixer is started the surface carrying the silver pattern may be in dry or wet state. In general, the treatment with the fixer does not take long, usually not longer than about 30 seconds and it may be carried out immediately after the processing and uncovering steps.

The fixer can be applied in different ways such as by rubbing with a roller, by wiping with an absorbent means e.g. with a plug of cotton or sponge, or by dipping the material to be treated in the fixer. The image-hydrophobizing step of the printing plate may also proceed automatically by conducting the printing plate through a device having a narrow channel filled with the fixer and conveying the printing plate at the end of the channel between two squeezing rollers removing the excess of liquid.

The following example illustrates the present invention without however, limiting it thereto. All parts, percentages and ratios are by weight unless otherwise indicated.

EXAMPLE 1

(Comparative example)

An imaging element was obtained by coating a grained, anodized and sealed aluminium support with a silver-receptive stratum containing 0.7 mg/m$^2$ PdS as physical development nuclei.

An intermediate layer was then provided on the dry silver-receptive stratum from an aqueous composition in such a way that the resulting dried layer had a weight of 0.5 g of polymethyl methacrylate beads per m$^2$, said composition comprising:

| | |
|---|---|
| a 20% dispersion of polymethyl methacrylate beads in a mixture of equal volumes of water and ethanol having an average diameter of 1.0 μm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water | 300 ml |
| (pH-value: 5.6) | |

Finally a substantially unhardened photosensitive negative-working cadmium-free gelatin silver chlorobromoiodide emulsion layer (97.98/2/0.02 mol %) was coated on the intermediate layer, the silver halide being provided in an amount corresponding to 2.40 g of silver nitrate per m$^2$ and the gelatin content of the emulsion layer being 0.58 g/m2 of ROUSSELOT T10985 (marketed by Rousselot S.A., France) and 1 g/m2 of KOEPF T7598 (marketed by Koepf A.G., Germany.)

Subsequently the imaging element was conditioned for 7 days at 22° C. and at a relative humidity of 35%, and cut in sheets which were conditioned for 7 days at 22° C. and at a relative humidity as given in table 1. Immediately afterwards they were packaged by ten with on each sheet a paper spacer, conditioned together with the sheets of the imaging element, in a laminate of paper-20 g/m$^2$/aluminium-24.3 g/m$^2$/low density polyethylene-28 g/ml which was then sealed. The paper spacer, manufactured by Intermills N.V., Belgium had a weight of 68 g/m$^2$, contained less than 10 ppm by weight of formaldehyde and had a pH of 6.8.

The different air-tight packages were then stored for 2 days at 60° C. and at a relative humidity of 35% and afterwards stored for 2 days at 22° C. and at a relative humidity of 35%.

After opening the sealed packages, one sheet from each package of the imaging element was exposed through a contact screen in a process-camera and immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layer.

To remove the developed silver halide emulsion layer and the intermediate layer from the aluminium foil the developed monosheet DTR material was rinsed for 10 s with a water jet at 30° C.

Next, the imaged surface of the aluminium foil was rubbed with a fixer to enhance the water-receptivity of the non-image areas and to make the image areas oleophilic ink-receptive. The fixer had the following composition :

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

The printing plates thus prepared were mounted beside each other on the same offset printing machine (HEIDELBERG GTO-46) and were used for printing under identical conditions. Commercial AQUA TAME 7035E marketed by Anchor/Lithemko Inc., Florida, USA was used at a 5% concentration in an aqueous solution containing 10% isopropanol as dampening solution and K+E 171, marketed by Kast+Ehinger, A.G., Germany was used as ink. A compressible rubber blanket was used.

The results with regard to the removal of the emulsion layer of the imaging elements after the rinsing and to the printing properties of the printing plates are given in Table 1.

The removal of the emulsion layer, the ink acceptance and the printing quality were evaluated as follows :

a) Em. removal: this value relates to the remainder of parts of emulsion layer on the printing plate in the image areas (I.A) as well as in the non-image areas (N.I.A) and is visually evaluated on a relative scale from 0 to 5, where 0 stands for a total absence of emulsion layer and where 5 indicates a substantially still complete coverage by emulsion layer.

b) Ink acc.: number of copies that has to be printed before a constant ink acceptance in the printing areas is obtained:

c) Pr. qual.: this value relates to the presence of white spots in the ink accepting areas of the 25th copy and is visually evaluated on a relative scale from 0 to 5, where 0 stands for a total absence of white spots in the printing areas and where 5 indicates a very high number of white spots in the printing areas.

TABLE 1

| No[d] | R.H.[e] (%) | Em. removal.[a] I.A. | N.I.A. | Inkacc.[b] | Pr. qual.[c] |
|---|---|---|---|---|---|
| I | 15 | 0 | 0 | 10 | 3–4 |
| II | 20 | 0 | 0 | 8 | 1–2 |
| III | 30 | 0 | 0 | 8 | 0–1 |
| IV | 40 | 0 | 0 | 25 | 1 |
| V | 50 | 1 | 0 | 50 | 1–2 |
| VI | 60 | 4 | 0 | >500 | 5 |

[d]No: the number of the package of the imaging element.
[e]R.H.: relative humidity.

Evaluation:
From the above it can be seen that printing plates obtained from the sheets of the imaging element, suitable for use in the present invention which have been stored in packages II–V in accordance with the invention show good printing properties e.g. an acceptable ink acceptance and a good printing quality. Printing plates obtained from the sheets of the imaging element, suitable for use in the present invention which have been stored in packages I or VI as comparaison show an unacceptable ink acceptance and a bad printing quality.

EXAMPLE 2
(Comparative example)

Printing plates were manufactured as described in example 1 with however the following modifications:

The laminate of paper—20 g/m²/aluminium—24.3 g/m²/ low density polyethylene—28 g/m¹ was replaced by a laminate of uniaxially oriented polyethylene films with the orientation perpendicular to each other with a weight of 90 g/m², a thickness of 100 μm and an optical density of more than 8.

The paper spacer, manufactured by Intermills N.V., Belgium was replaced by a paper spacer of Illig'sche Papierfabrik Gmbh, Germany, having a weight of 58 g/m², containing less than 10 ppm by weight of formaldehyde and having a pH of 6.8.

The results with regard to the removal of the emulsion layer of the imaging elements after the rinsing and to the printing properties of the printing plates are given in Table 2.

The removal of the emulsion layer, the ink acceptance and the printing quality were evaluated as indicated for table 1.

TABLE 2

| No[d] | R.H.[e] (%) | Em. removal.[a] I.A. | N.I.A. | Inkacc.[b] | Pr. qual.[c] |
|---|---|---|---|---|---|
| I | 15 | 0 | 0 | 12 | 3–4 |
| II | 20 | 0 | 0 | 9 | 1–2 |
| III | 30 | 0 | 0 | 10 | 0–1 |
| IV | 40 | 0 | 0 | 13 | 0–1 |
| V | 50 | 0 | 0 | 16 | 0–1 |
| VI | 60 | 2 | 0 | 20 | 1–2 |

[d]No: the number of the package of the imaging element.
[e]R.H.: relative humidity.

Evaluation:
From the above it can be seen that printing plates obtained from the sheets of the imaging element, suitable for use in the present invention which have been stored in packages II–V in accordance with the invention show good printing properties e.g. an acceptable ink acceptance and a good printing quality. Printing plates obtained from the sheets of the imaging element, suitable for use in the present invention which have been stored in packages I or VI as comparaison show a worse ink acceptance and a worse printing quality.

What is claimed is:

1. A sealed package of at least two sheets of an imaging element in a packaging material, said imaging element comprising in the order given (i) a hydrophilic base, (ii) an image receiving layer containing physical development nuclei, (iii) an intermediate layer comprising a non-proteinic hydrophilic film-forming polymer or hydrophobic polymer beads having an average diameter not lower than 0.2 Am and having been prepared by polymerization of an ethylenically unsaturated monomer, and (iv) a photosensitive layer containing a silver halide emulsion being in water permeable relationship with said image receiving layer, characterized in that the surrounding of the imaging element in such a package has at 22° C. a relative humidity between 20% and 50% and that said package contains between each sheet of the imaging element a paper spacer having a weight of more than 15 g/m², containing less than 20 ppm by weight of formaldehyde and having a pH of less than 9.

2. A package according to claim 1 wherein said surrounding has at 22° C. a relative humidity between 30% and 40%.

3. A package according to claim 1 or 2 wherein said packaging material has an air permeability of less than 3.5 ml/s as measured according to DIN 53120.

4. A package according to any of claims 1 to 3 wherein said packaging material is an aluminium foil, a laminate of aluminium or a laminate of uniaxially oriented polyethylene films with the orientation perpendicular to each other.

5. A package according to any of claims 1 to 3 wherein said package contains as the bottom and the top sheet a cardboard sheet.

6. A package according to claim 5 wherein said cardboard sheet has a weight of more than 300 g/m² and contains less than 40 ppm by weight of formaldehyde.

* * * * *

UNITED STATES PATENT AND TRADEMARK OFFICE
CERTIFICATE OF CORRECTION

PATENT NO. : 6,130,023
DATED : October 10, 2000
INVENTOR(S) : Paul Coppens et al It is certified that error appears in the above-indentified patent and that said Letters Patent is hereby corrected as shown below:

Column 13, TABLE 1, line 5, fifth column heading,

"Inkacc.$^{b)}$" should read -- Ink acc.$^{b)}$ --.

Column 13, TABLE 2, line 53, fifth column heading,

"Inkacc.$^{b)}$" should read -- Ink acc.$^{b)}$ --.

Column 14, TABLE 2-continued, line 5, fifth column heading,

"Inkacc.$^{b)}$" should read -- Ink acc.$^{b)}$ --.

Column 14, line 30, claim 1, "0.2 Am" should read

-- 0.2 $\mu$m --.

Signed and Sealed this

Twenty-second Day of May, 2001

Attest:

NICHOLAS P. GODICI

Attesting Officer

Acting Director of the United States Patent and Trademark Office